United States Patent

Gaiser

[15] 3,695,502

[45] Oct. 3, 1972

[54] BONDING TOOL

[72] Inventor: Floyd E. Gaiser, 12552 Singingwood Drive, Santa Ana, Calif. 92705

[22] Filed: Sept. 14, 1970

[21] Appl. No.: 71,662

[52] U.S. Cl. ........................228/4, 29/471.1, 29/589, 29/626, 228/1, 228/49

[51] Int. Cl. ............................B23k 1/00, B23k 37/04

[58] Field of Search ....................228/1, 3, 4, 5, 6, 49; 29/470.1, 471.1, 589, 626

[56] References Cited

UNITED STATES PATENTS

| | | | |
|---|---|---|---|
| 3,452,917 | 7/1969 | Schneider | 228/49 |
| 3,464,102 | 9/1969 | Soloff | 228/1 X |
| 3,475,814 | 11/1969 | Santangini | 29/470.1 |
| 3,568,307 | 3/1971 | Zanger et al | 29/589 |

*Primary Examiner*—John F. Campbell
*Assistant Examiner*—R. J. Craig
*Attorney*—Nienow & Frater

[57] ABSTRACT

A microcircuit wafer or die bonding tool for use in microcircuit bonding apparatus to transport, locate and orient a microcircuit wafer. A working surface within the tip of the tool is characterized by a plurality of inclined facets adapted to engage parametrical edges of an upper surface of the wafer and undercut to provide both positive control of and minimum contact pressure upon the surfaces of the wafer during bonding of the wafer to a substrate.

6 Claims, 8 Drawing Figures

INVENTOR.
FLOYD E. GAISER
BY
Nienow & Frater
ATTORNEYS

INVENTOR.
FLOYD E. GAISER
BY
Nienow & Frater
ATTORNEYS

BONDING TOOL

BACKGROUND OF THE INVENTION

This invention relates to a tool for use in apparatus for picking up miniature semiconductor dice and microcircuit wafers and transferring them to substrates to which they are then bonded. More particularly, the invention relates to an improved tool providing increased control and reduced work spoilage in the grasping of individual wafers or dice from a tray for subsequently bonding them to a subassembly.

In the fabrication of microcircuit assemblies, individual dice or microcircuit wafers having surface electrodes thereon are first bonded to substrates or flatback components prior to the connection of lead wires to or interconnections between the surface electrodes thereof. One means of assembling these dice upon a substrate or flatback component is to pick up an individual wafer or die by its upper surface using a tubular pickup and bonding tool having a cavernous recessed portion or working face in its tip and having a vacuum applied at a distal end of its bore, and transfer the wafer or die to the intended substrate. Such a tool and the apparatus in which it is employed are described more fully in U.S. Pat. No. 3,458,102 issued to Zanger, et al. The tool so described employs in the tip a cavernous recess formed of a plurality of exposed upwardly inwardly converging flat surfaces which are intended to engage a plurality of parametrical edges of the upper surface of a microcircuit wafer to be transported. However, in engaging the upper die surface of the die or wafer, by means of the upwardly inwardly converging surfaces, it is possible to wedge or jam a die in the tool in a manner damaging the die or from which damage will result in extricating it. The likelihood of a hang-up or jamming, with consequent injury to the die, is increased during subsequent attempts to bond the die to the substrate; which initial jamming or injury upon the tool's grasping the die may interfere with the subsequent bonding process itself. Thus, the above noted deficiencies serve to impede production ratio as well as cause workpiece spoilage, whereby production rates are reduced and costs per acceptable production unit are increased.

SUMMARY OF THE INVENTION

By means of the concept of the subject invention, the above-noted shortcomings and disadvantages of the prior art are avoided, and an improved pickup and bonding tool is provided having a preselectively undercut cavernous recess in the tool tip. Such undercutting allows the working surface or recess of the tool tip to exercise increased positive control over and reduce contact pressures upon the wafer during handling thereof by the tool, including both pickup and bonding of the wafer.

Accordingly, it is a broad object of the subject invention to provide a microcircuit wafer bonding and pickup tool cooperable with a wafer as to reduce hang-up thereof in or damage thereto from the cooperation thereof with the tool.

It is another object of the invention to provide a tool having a recessed working face in a tip thereof and undercut to enable improved cooperation with an intended microcircuit wafer workpiece.

It is a further object to provide an improved tool having a recessed working face in the tip thereof which face is preselectively undercut to allow increased control over orientation of the workpiece.

Still another object is to provide a tool having A recessed working face in a tip thereof and formed of upwardly inclined facets, undercut at the corners formed by contiguous facets as to relieve edge pressures applied by said tool to a workpiece held thereby.

These and other objects of the invention will become apparent from the following description, taken together with the accompanying drawings, in which.

In the figures, like reference characters refer to like parts.

DESCRIPTION OF THE PREFERRED EMBODIMENTS

Figures 1, 2, 3:
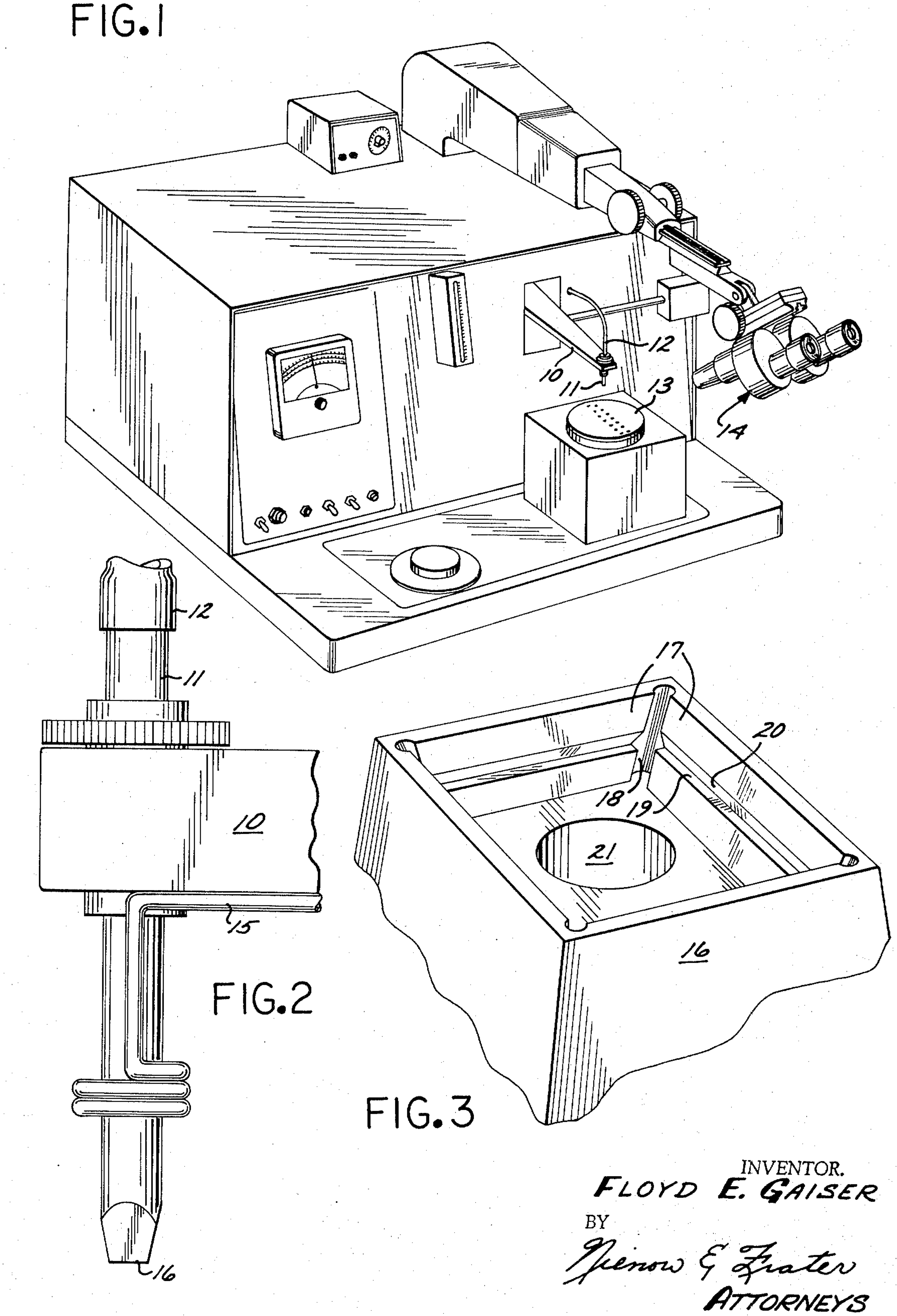
FIG. 1 is a perspective view of a system in which the invention may be advantageously utilized.
FIG. 2 is a view in elevation of a wafer pickup and bonding tool, as mounted or installed in the device of FIG. 1 and in which the invention may be embodied.
FIG. 3 is a perspective view of the lower tip of the tool of FIG. 2, and embodying the concept of the invention.
Figure 4:
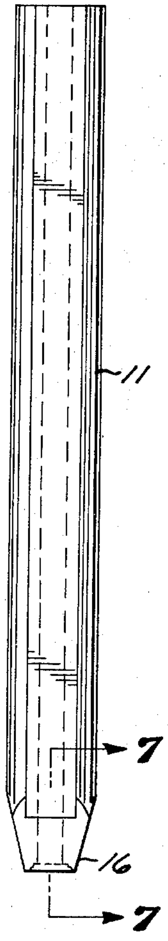
FIG. 4 is an elevation view, partially in phantom, of the tool of FIG. 2 and 3, showing the tubular or central axial apertured shank thereof in phantom.

Referring now to FIG. 1, there is illustrated a system for bonding microcircuit wafers or semi-conductor dies to substrates or flatback components in the production of microcircuit assemblies. There is shown an adjustable manipulator 10 upon which the pickup and bonding tool 11 may be mounted in a vertical position. A vacuum line 12 is adapted to engage an upper or distal end of a tubular shank of tool 11 (as shown more particularly in FIG. 2) in pneumatic circuits, the cooperation of which assists in the picking up and transferring of a wafer by means of tool 11. Such tubular aspect is shown more particularly in phantom line in FIG. 4. There is also provided a tray 13 on to which wafers or dice 14 may be loaded and having a mirrored surface. Hingedly supported stereo microscope 14, in cooperation with the mirrored surface of tray 13, allows the operator to view the position of the underside of the lower tip or working end of tool 11, relative to that of a wafer of interest, and conveniently cause the tool tip to engage and pick up such wafer. The wafer is then bonded to a desired substrate by tool 11 holding it against such substrate and heat being applied to the tool by radio frequency or other electrical means, indicated generally as element 15 in FIG. 2. In combination with such application of heat to tool 11, mechanical vibration may also be applied thereto through element 10 in order to effect a scrubbing action between the contiguous surfaces of the wafer and substrate to augment such heating effect far enhancing the bonding operation. A further description of such general operation is to be found in U. S. Pat. No. 3,458,102 issued to E. A. Zanger, et al.

The tip 16 of tool 11 (in FIG. 2) embodies the concept of my invention and is illustrated more particularly in FIG. 3 as including a cavernous recessed portion therein, having a plurality of exposed inwardly converging surfaces adapted to engage a plurality of individual asymmetrical edges of the upper surface of a wafer device in parallel alignment therewith. In other words, the inwardly converging surfaces comprise inclined facets disposed in a pyramidal configuration for convenience in mutual alignment and location of the tool and wafer. The corners 18 formed by contiguous ones of the facets 17 are undercut to reduce the maximum pressure exerted at such corners upon a wafer and to reduce the likelihood of wafer getting hung up or jammed in the tool, with consequent damage or work spoilage plus tool down time (to clean the tool), whereby production costs are correspondingly increased.

Figure 6:
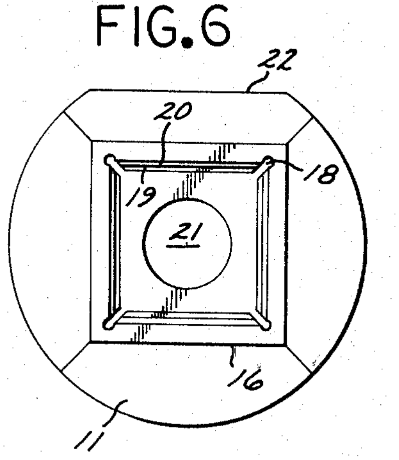
FIG. 6 is a plan view (from the bottom) of the tool tip, illustrating the embodiment of the inventive concept.

Another aspect of the invention is the further undercutting of the exposed pyramidal structure to form a parametrical ledge or seat 19 and associated back wall 20 as shown in FIG. 3. Back wall 20 serves to control the orientation of the wafer relative to the tool tip, while ledge 19 allows the wafer to "seat" without getting cocked, jammed or hung up in the tool tip, the angularly inclined pyramidal faces of the tip interior cooperating to guide the wafer to such controlled orientation under the urging of the vacuum pressure employed at the central aperture 21 of the tool. The parametrical undercutting represented by ledge 19 and back wall 20 serve to relieve the pressure applied at a single point upon either the face or edge of the wafer, as to prevent damage thereto. Also, such parametrical undercut, in allowing an even seating pressure about the peripherally seating area of the wafer, provides a more positive cooperation with the vacuum pressure applied through aperture 21 for securing a wafer in the pickup and transport thereof by means of the tool. Such undercut aspect of the interior of the tool tip 16 is shown in the inverse plan view of FIG. 6. Also shown more clearly in FIG. 6 is the flat side or longitudinally extending flat face 22 of tool 11 for "keying" or matingly orienting the tool in the mounting illustrated in FIG. 1.

Figure 5:
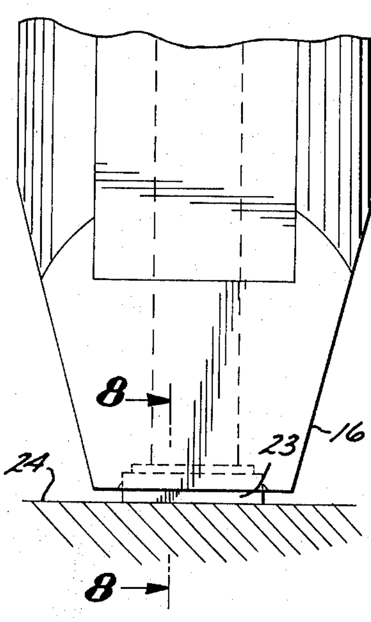
FIG. 5 is a view in elevation of the tip of the tool as engaged against a wafer or microcircuit die lying upon an optical flat.
Figure 7:
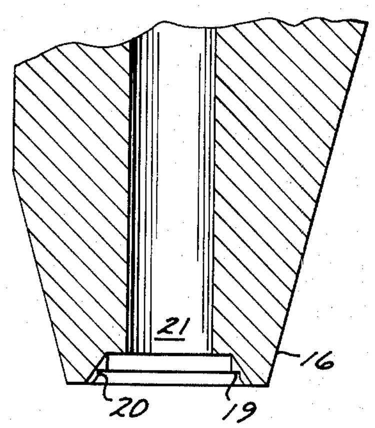
FIG. 7 is a central section, taken along lines 7—7 of FIG. 4, of the tool tip.
Figure 8:
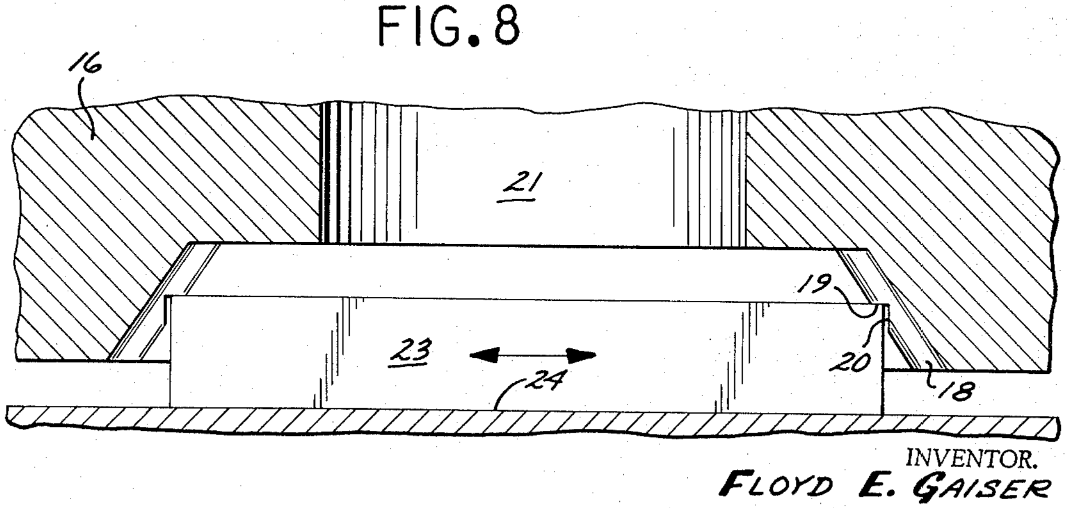
FIG. 8 is a central section, taken along lines 8—8 of FIG. 5.

A vertical central section along lines 7—7 of the tip 16 of the tool 11 (of FIG. 4) is generally shown in FIG. 7. The axial depth of the seat or ledge of the parametrical undercut is selected to be about one-half or less than the nominal thickness of the wafer to be bonded, as shown in FIG. 5 and as may be more easily seen from FIG. 8. In FIGS. 5 and 8, the tip 16 of the bonding tool is illustrated as engaging a wafer 23 within the cavernous recess of tip 16, while ledge 19 serves to minimize local pressure in the seating of wafer 23 within the tip 16. Undercut 18 also serves to reduce pressures applied at the corners of the face of wafer 23. Thus, such combination of features reduces maximum pressure points applied to wafer 23, while ledge 19 avoids jamming up of the wafer in the inclined exposed faces of the cavernous interior of the tip, particularly during the scrubbing action of a bonding operation, whereby work spoilage and tool down time are reduced.

Accordingly, there has been described novel and useful improvements in a microcircuit bonding tool, whereby production rates may be increased and production costs decreased in the fabrication of microcircuit assemblies.

I claim:

1. A bonding tool for positioning and orienting a solid state wafer device of the type having substantially flat upper and lower surface and a plurality of individual vertical sides at the parametrical edges, said tool comprising,
   - an upper body portion adapted to connect to a holder;
   - a lower end portion terminating in a tip;
   - a cavernous recess in said tip having a plurality of exposed inwardly converging surfaces adapted to engage corresponding parametrical edges of the upper surface of said wafer device, bore formed in said lower end portion communicating with said recess and adapted to apply a partial vacuum thereto, a ledge formed in each of said surfaces contiguously arranged with respect to the ledges in adjacent surfaces to provide a parametrical ledge, and corner reliefs between adjacent converging surfaces for proper operation of said partial vacuum and accommodation of the corners of said wafer device.

2. A bonding tool according to claim 1 wherein said tip is formed with a substantially coplanar end face and said parametrical ledge is substantially parallel thereto.

3. A bonding tool according to claim 1 wherein said parametrical ledge is a substantially closed continuous ledge affording a through opening incapable of permitting passage therethrough of the waver device, said ledge having external dimensions sufficient to accommodate said device.

4. A bonding tool according to claim 3 wherein said parametrical ledge is sufficiently narrow as compared to the external dimensions and the size of said wafer device to contact said device along a minimal area of one of its surfaces while preventing its passage through said through opening.

5. A bonding tool according to claim 4 wherein said corner reliefs are sufficiently deep to accommodate sharp corners of a wafer device when contacting said parametrical ledge.

6. A bonding tool according to claim 5 wherein said converging surfaces form a pyramidal recess converging from an end face on said tip and said parametrical ledge effectively interrupts said pyramidal configuration for retaining said wafer device but only along the edges of a surface thereof.

* * * * *